US012170266B2

(12) United States Patent
Park

(10) Patent No.: US 12,170,266 B2
(45) Date of Patent: Dec. 17, 2024

(54) SEMICONDUCTOR PACKAGE

(71) Applicant: Samsung Electronics Co., Ltd., Suwon-si (KR)

(72) Inventor: Wanho Park, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/216,445

(22) Filed: Jun. 29, 2023

(65) Prior Publication Data

US 2023/0343752 A1 Oct. 26, 2023

Related U.S. Application Data

(63) Continuation of application No. 17/216,142, filed on Mar. 29, 2021, now Pat. No. 11,721,671.

(30) Foreign Application Priority Data

Jul. 17, 2020 (KR) ........................ 10-2020-0089078

(51) Int. Cl.
| | |
|---|---|
| *H01L 25/065* | (2023.01) |
| *H01L 23/16* | (2006.01) |
| *H01L 23/31* | (2006.01) |
| *H01L 23/538* | (2006.01) |

(52) U.S. Cl.
CPC .......... *H01L 25/0657* (2013.01); *H01L 23/16* (2013.01); *H01L 23/31* (2013.01); *H01L 23/5386* (2013.01)

(58) Field of Classification Search
CPC ..... H01L 25/0657; H01L 23/16; H01L 23/31; H01L 23/5386; H10B 80/00
See application file for complete search history.

(56) References Cited

U.S. PATENT DOCUMENTS

| | | | |
|---|---|---|---|
| 8,513,793 | B2 | 8/2013 | Han |
| 8,664,757 | B2 | 3/2014 | Cho et al. |
| 8,723,332 | B2 | 5/2014 | McElrea et al. |
| 9,324,661 | B2 | 4/2016 | Kim et al. |
| 9,412,720 | B2 | 8/2016 | Nam et al. |
| 10,629,561 | B2 | 4/2020 | Zhao et al. |
| 2009/0289356 | A1* | 11/2009 | Camacho ................ H01L 24/05 257/737 |

FOREIGN PATENT DOCUMENTS

| | | |
|---|---|---|
| KR | 1020080014302 A | 2/2008 |
| KR | 1020080041433 A | 5/2008 |
| KR | 101774938 B1 | 9/2017 |

* cited by examiner

*Primary Examiner* — Timor Karimy
(74) *Attorney, Agent, or Firm* — Muir Patent Law, PLLC

(57) ABSTRACT

A semiconductor package includes a chip stack comprising semiconductor chips vertically stacked on a substrate in a first direction perpendicular to a top surface of the substrate, pillars between the substrate and the chip stack, an adhesive layer on a bottom surface of a lowermost semiconductor chip of the semiconductor chips, a first lower protective layer between the adhesive layer and the pillars, a second lower protective layer between the first lower protective layer and the adhesive layer, and a mold layer covering the chip stack and filling a space between the pillars. A thickness of the second lower protective layer in the first direction is greater than a thickness of the adhesive layer in the first direction.

19 Claims, 15 Drawing Sheets

SEMICONDUCTOR PACKAGE

CROSS-REFERENCE TO RELATED APPLICATION

This U.S. non-provisional patent application is a continuation of and claims priority to U.S. patent application Ser. No. 17/216,142 filed Mar. 29, 2021, which claims priority under 35 U.S.C. § 119 to Korean Patent Application No. 10-2020-0089078, filed on Jul. 17, 2020, in the Korean Intellectual Property Office, the disclosures of which are incorporated by reference herein in their entirety.

BACKGROUND

Embodiments of the inventive concepts relate to a semiconductor package and, more particularly, to a semiconductor package including a plurality of stacked semiconductor chips.

Recently, portable devices have been increasingly demanded in the electronics market, and thus small and light electronic components mounted in the electronics have been required. A semiconductor package technique of integrating a plurality of individual components in a single package as well as a technique of reducing a size of an individual component may be required to realize small and light electronic components. As the number of semiconductor chips in a semiconductor package increases, miniaturization and reliability improvement of the semiconductor package may be increasingly demanded.

SUMMARY

Embodiments of the inventive concepts may provide a semiconductor package capable of improving reliability and of reducing a size.

In an aspect, a semiconductor package may include a chip stack comprising semiconductor chips vertically stacked on a substrate in a first direction perpendicular to a top surface of the substrate, pillars between the substrate and the chip stack, an adhesive layer on a bottom surface of a lowermost semiconductor chip of the semiconductor chips, a first lower protective layer between the adhesive layer and the pillars, a second lower protective layer between the first lower protective layer and the adhesive layer, and a mold layer covering the chip stack and filling a space between the pillars. A thickness of the second lower protective layer in the first direction may be greater than a thickness of the adhesive layer in the first direction.

In an aspect, a semiconductor package may include a chip stack comprising semiconductor chips vertically stacked on a substrate in a first direction perpendicular to a top surface of the substrate, the chip stack comprising a first semiconductor chip located at a lowest level of the semiconductor chips, pillars between the substrate and the first semiconductor chip, an adhesive layer on a bottom surface of the first semiconductor chip, a first lower protective layer between the adhesive layer and the pillars, and a second lower protective layer between the first lower protective layer and the adhesive layer. The first semiconductor chip may have first sidewalls opposite to each other in a second direction parallel to the top surface of the substrate, and the second lower protective layer may have second sidewalls opposite to each other in the second direction. The second sidewalls may be offset from the first sidewalls in the second direction.

In an aspect, a semiconductor package may include a chip stack comprising semiconductor chips vertically stacked on a substrate in a first direction perpendicular to a top surface of the substrate, the chip stack comprising a first semiconductor chip located at a lowest level and a second semiconductor chip located at a highest level of the semiconductor chips, upper conductive pads on a top surface of the substrate, lower conductive pads on a bottom surface of the substrate, pillars between the top surface of the substrate and the chip stack, wherein at least one of the pillars comprises a lower semiconductor chip electrically connected to a corresponding one of the upper conductive pads, an adhesive layer on a bottom surface of the first semiconductor chip, a first lower protective layer between the adhesive layer and the pillars, a second lower protective layer between the first lower protective layer and the adhesive layer, a first upper protective layer on the second semiconductor chip, a second upper protective layer on the first upper protective layer, and a mold layer covering the chip stack and filling a space between the pillars. A thickness of the first upper protective layer in the first direction may be less than a thickness of the second upper protective layer in the first direction.

BRIEF DESCRIPTION OF THE DRAWINGS

The inventive concepts will become more apparent in view of the attached drawings and accompanying detailed description.

DETAILED DESCRIPTION OF THE EMBODIMENTS

Semiconductor packages according to embodiments of the inventive concepts will be described hereinafter in detail with reference to the accompanying drawings.

Figure 1:
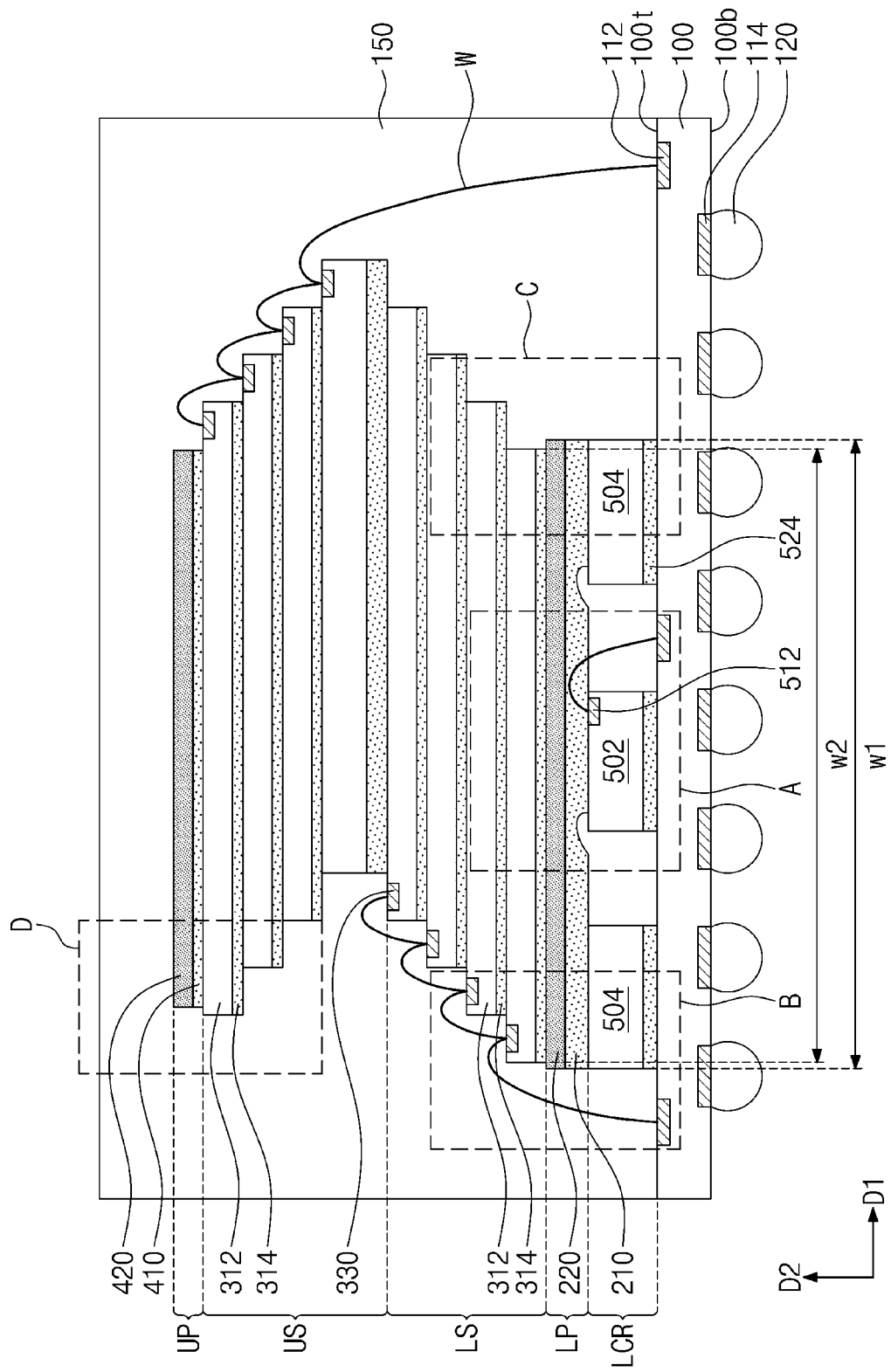
FIG. 1 is a cross-sectional view illustrating a semiconductor package according to some embodiments of the inventive concepts.

FIG. 1 is a cross-sectional view illustrating a semiconductor package according to some embodiments of the inventive concepts.

Referring to FIG. 1, a semiconductor package according to some embodiments of the inventive concepts may include a substrate 100, a lower chip region LCR, a lower protective layer region LP, a lower stack LS, an upper stack US, and an upper protective layer region UP.

The substrate 100 may correspond to a lower portion of the semiconductor package. The substrate 100 may support semiconductor chips 312 and may provide a signal transmission path between an external device and the semiconductor chips 312. The substrate 100 may include internal interconnection lines. The substrate 100 may include, for example, a printed circuit board (PCB).

Upper conductive pads 112 may be disposed on a top surface 100t of the substrate 100, and lower conductive pads 114 may be disposed on a bottom surface 100b of the substrate 100. The upper conductive pads 112 and the lower conductive pads 114 may be electrically connected to each other through the internal interconnection lines of the substrate 100. The upper conductive pads 112 may be electrically connected to chip pads 330 of the semiconductor chips 312. In some embodiments, the upper conductive pads 112 may be connected to the chip pads 330 through conductive wires W.

External connection terminals 120 may be bonded to the lower conductive pads 114. For example, each of the external connection terminals 120 may include a solder ball or a solder bump. The external connection terminals 120 may be two-dimensionally arranged on the bottom surface 100b of the substrate 100 to constitute a ball grid array (BGA) structure.

The lower chip region LCR may be provided on the top surface 100t of the substrate 100. The lower chip region LCR may include a plurality of pillars 502 and 504. The term "pillar" refers to a physical support element or support pillar that support the lower stack LS and the upper stack US. The plurality of pillars 502 and 504 may be spaced apart from each other in a first direction D1 parallel to the top surface 100t of the substrate. The pillars 502 and 504 may include one of a lower semiconductor chip 502 and spacer 504. In some embodiments, the lower semiconductor chip 502 may be provided between the spacers 504 spaced apart from each other. Spaces between the lower semiconductor chip 502 and the spacers 504 may be filled with a mold layer 150. The pillars 502 and 504 may have a relative area that is, for example, ⅓ the area of the semiconductor chips 312 in the lower stack LS and the upper stack US.

Lower adhesive layers 524 may be provided between the top surface 100t of the substrate 100 and bottom surfaces of the plurality of pillars 502 and 504. The lower adhesive layer 524 may include an adhesive material of which an adhesive property is changeable by ultraviolet (UV) light or heat. For example, the lower adhesive layer 524 may include a die attach film (DAF).

A lower chip pad 512 may be disposed on a top surface of the lower semiconductor chip 502 among the plurality of pillars 502 and 504. The lower chip pad 512 may be electrically connected to a corresponding one of the upper conductive pads 112 through a conductive wire W. The lower semiconductor chip 502 may include a controller chip or a buffer memory chip. For example, the controller chip may include a central processing unit (CPU), an internal memory, a buffer memory control unit, a host interface, and a flash interface. The spacers 504 among the plurality of pillars 502 and 504 may not have a conductive pad and an integrated circuit. The spacers 504 may include an insulator or a semiconductor material.

The lower protective layer region LP may be provided on the plurality of pillars 502 and 504. The lower protective layer region LP may be disposed between the lower stack LS and the plurality of pillars 502 and 504 to buffer stress transferred from the lower chip region LCR toward the semiconductor chips 312. The lower protective layer region LP may include a first lower protective layer 210 and a second lower protective layer 220 on the first lower protective layer 210. In some embodiments, a thickness of the lower protective layer region LP may be greater than a thickness of a lowermost one of the semiconductor chips 312.

The lower stack LS and the upper stack US may be sequentially stacked on the lower protective layer region LP. Each of the lower stack LS and the upper stack US may include the semiconductor chips 312 and adhesive layers 314, which are alternately stacked. The semiconductor chips 312 may be stacked in the form of a staircase or cascade structure. For example, the semiconductor chips 312 in the lower stack LS may have a staircase structure in the first direction D1, and the semiconductor chips 312 in the upper stack US may have a staircase structure in an opposite direction to the first direction D1. The semiconductor chips 312 may be memory chips. For example, the semiconductor chips 312 may be NAND flash memory chips.

The adhesive layers 314 may be provided on bottom surfaces of the semiconductor chips 312, respectively. The adhesive layers 314 may include an adhesive material of which an adhesive property is changeable by UV light or heat. For example, each of the adhesive layers 314 may include a die attach film (DAF). For example, the DAF may be a polymer adhesive and may include or may be formed of a thermosetting polymer or a thermoplastic polymer. The thermosetting polymer may include or may be formed of monomers having a three-dimensional (3D) cross-link structure by heating. The thermoplastic polymer may include or may be formed of monomers having a linear polymer structure by heating. The lower stack LS may be adhered to a top surface of the second lower protective layer 220 through the adhesive layer 314 located on the bottom surface of the lowermost semiconductor chip 312 of the semiconductor chips 312.

A lowermost semiconductor chip 312 of the semiconductor chips 312 in the upper stack US may have a thickness greater than those of other semiconductor chips 312. In addition, the adhesive layer 314 located on the bottom surface of the lowermost semiconductor chip 312 in the upper stack US may have a thickness greater than those of the adhesive layers 314 located on the bottom surfaces of the other semiconductor chips 312. In some embodiments, the thickness of the lowermost semiconductor chip 312 of the semiconductor chips 312 in the upper stack US may be greater than a thickness of the lower protective layer region LP.

The chip pads 330 may be formed on top surfaces of the semiconductor chips 312. The chip pads 330 may be formed on edges of the semiconductor chips 312 and may be covered by the mold layer 150. The chip pads 330 may not be covered by the adhesive layers 314 or the semiconductor chips 312. The chip pads 330 may be connected to the upper conductive pads 112 of the substrate 100 through the conductive wires W.

The upper protective layer region UP may be provided on the upper stack US. The upper protective layer region UP may protect the semiconductor chips 312 from warpage of the substrate 100 or stress applied to a top surface of the mold layer 150. The upper protective layer region UP may include a first upper protective layer 410 and a second upper protective layer 420 on the first upper protective layer 410. In some embodiments, a thickness of the upper protective layer region UP may be less than a thickness of the lower protective layer region LP.

The mold layer 150 covering the upper stack US and the lower stack LS may be provided on the top surface 100t of the substrate 100. The mold layer 150 may cover the first lower protective layer 210, the second lower protective layer 220, the first upper protective layer 410, and the second upper protective layer 420. The mold layer 150 may fill spaces between the pillars 502 and 504. Sidewalls of the mold layer 150 may be vertically aligned or substantially coplanar with sidewalls of the substrate 100. The top surface of the mold layer 150 may be substantially parallel to the top surface 100t of the substrate 100. The mold layer 150 may include an insulating polymer. For example, the mold layer 150 may include or may be formed of an epoxy molding compound. The composition of the mold layer 150 is different from the composition of each of the first lower protective layer 210, the second lower protective layer 220, the first upper protective layer 410, and the second upper protective layer 420.

Figure 2A:
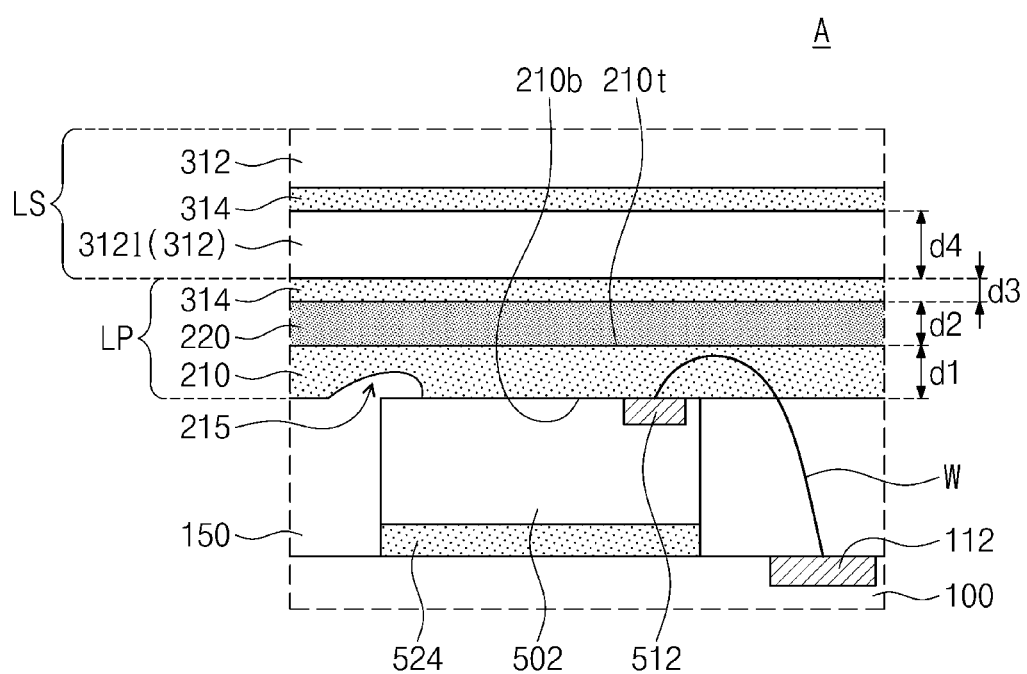
FIG. 2A is an enlarged cross-sectional view of a portion 'A' of FIG. 1.
Figure 2B:
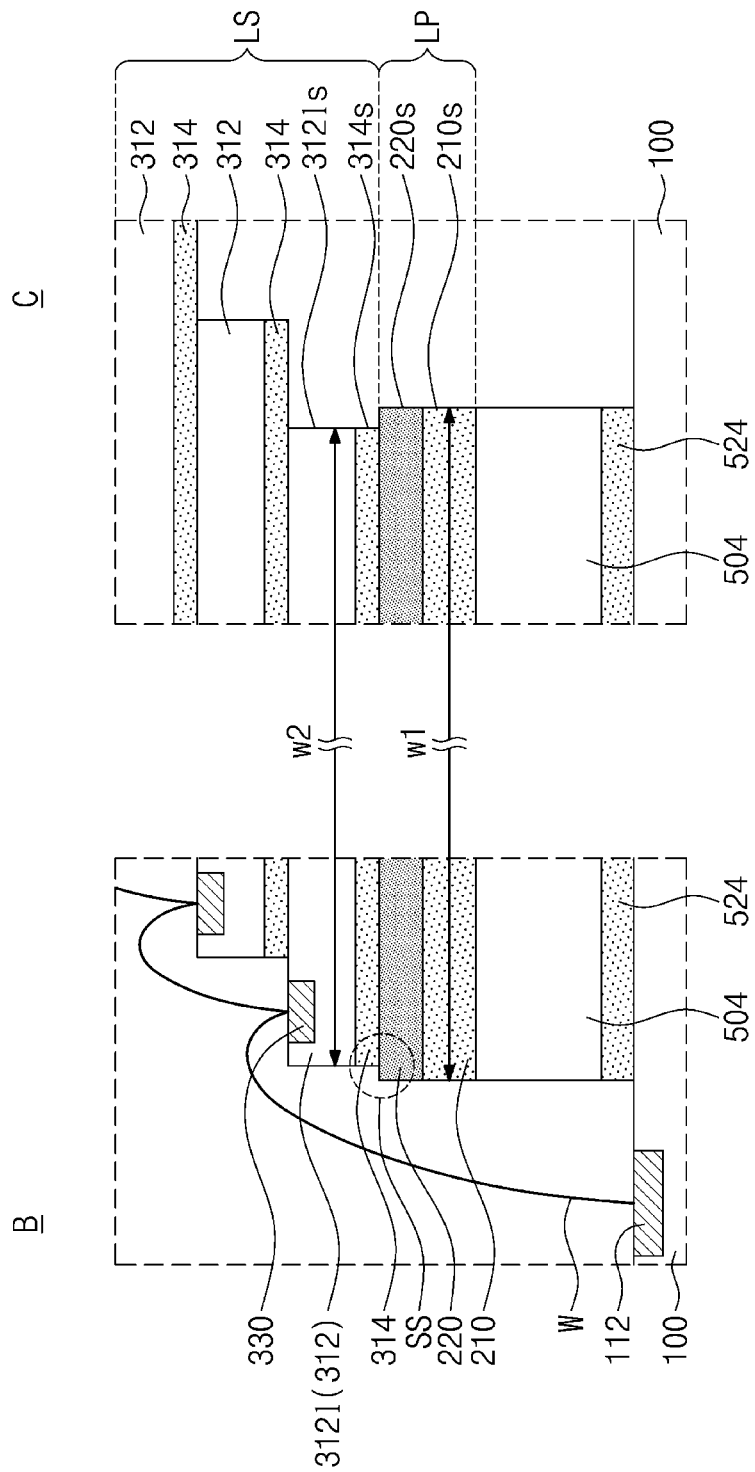
FIG. 2B is an enlarged cross-sectional view of portions 'B' and 'C' of FIG. 1.
Figure 2C:
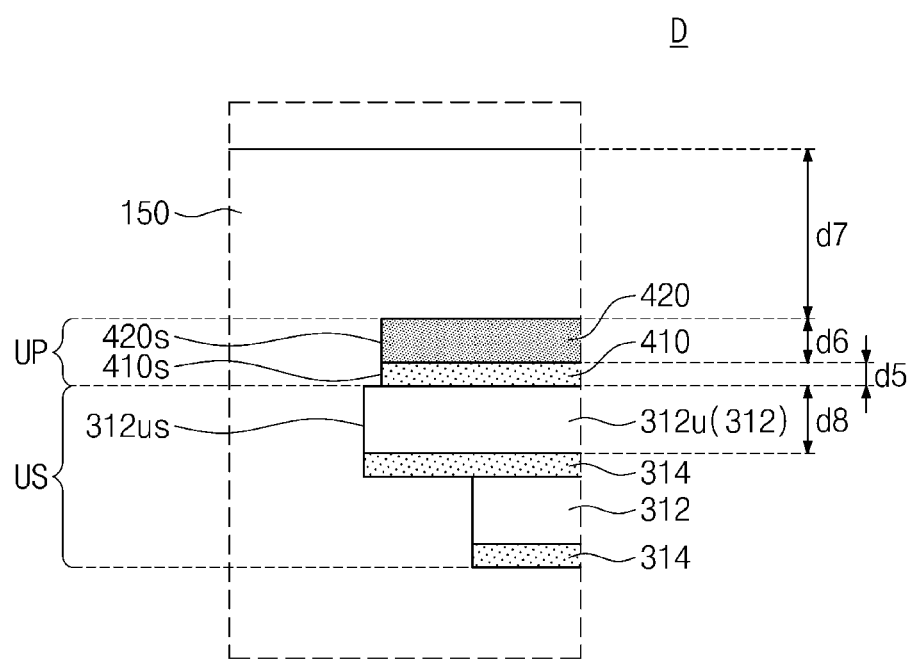
FIG. 2C is an enlarged cross-sectional view of a portion 'D' of FIG. 1.

FIG. 2A is an enlarged cross-sectional view of a portion 'A' of FIG. 1. FIG. 2B is an enlarged cross-sectional view of portions 'B' and 'C' of FIG. 1. FIG. 2C is an enlarged cross-sectional view of a portion 'D' of FIG. 1.

Referring to FIGS. 1 and 2A, the first lower protective layer 210 may be disposed directly on top surfaces of the pillars 502 and 504. The first lower protective layer 210 may have a recess 215 recessed from its bottom surface 210b toward its top surface 210t. The recess 215 may be concave in a second direction D2 perpendicular to the top surface 100t of the substrate 100 and may have a rounded inner surface. The recess 215 may have an asymmetrical shape in the first direction D1. The recess 215 may have a portion vertically overlapping with the lower semiconductor chip 502. Thus, a portion of the top surface of the pillar 502 or 504, which is located under the recess 215, may not be covered by the first lower protective layer 210. The recess 215 may be filled with the mold layer 150, and the portion of the top surface of the pillar 502 or 504 may be covered by the mold layer 150. A thickness d1 of the first lower protective layer 210 may be greater than a thickness d3 of the adhesive layer 314. In some embodiments, the thickness d1 of the first lower protective layer 210 ranges from 4 times to 10 times the thickness d3 of the adhesive layer 314. For example, the thickness d1 of the first lower protective layer 210 may range from 40 μm to 60 μm. A vertical height of the recess 215 may range from 1 μm to 30 μm. The first lower protective layer 210 may completely cover a top surface of the lower chip pad 512.

The conductive wire W may penetrate the first lower protective layer 210 to electrically connect the lower chip pad 512 to the corresponding upper conductive pad 112. A top end of the conductive wire W may be located at a lower level than a bottom surface of the second lower protective layer 220. For example, the conductive wire W may not penetrate the second lower protective layer 220.

The second lower protective layer 220 may be in contact with the top surface 210t of the first lower protective layer 210 and may completely cover the top surface 210t of the first lower protective layer 210. The second lower protective layer 220 may be spaced apart from the lowermost semiconductor chip 3121 (hereinafter, referred to as a first semiconductor chip) of the semiconductor chips 312 with the adhesive layer 314 interposed therebetween. The second lower protective layer 220 may be in contact with a bottom surface of the adhesive layer 314. The second lower protective layer 220 may have a thickness d2 that is less than a thickness d1 of the first lower protective layer 210. The thickness d2 of the second lower protective layer 220 may be greater than a thickness d3 of the adhesive layer 314. The thickness d2 of the second lower protective layer 220 ranges from 3 times to 6 times the thickness d3 of the adhesive layer 314. For example, the thickness d2 of the second lower protective layer 220 may range from 3 μm to 60 μm. For example, the thickness d3 of the adhesive layer 314 may range from 1 μm to 10 μm. It will be understood that when an element is referred to as "contacting" or "in contact with" another element, there are no intervening elements present at the point of contact.

The second lower protective layer 220 may have a strength higher than those of the first lower protective layer 210 and the adhesive layer 314. For example, the second lower protective layer 220 may have a tensile strength, a compressive strength, a bending strength and a torsional strength, which are higher than those of the first lower protective layer 210 and the adhesive layer 314. In addition, the second lower protective layer 220 may have a stiffness and a hardness, which are higher than those of the first lower protective layer 210 and the adhesive layer 314. The first lower protective layer 210 may include or may be formed of a die attach film (DAF). For example, the DAF may be a polymer adhesive and may include or may be formed of a thermosetting polymer or a thermoplastic polymer. The second lower protective layer 220 may include or may be formed of, for example, polyimide (PI).

The adhesive layer 314 and the first semiconductor chip 3121 may be sequentially stacked on the second lower protective layer 220. A thickness d4 of the first semiconductor chip 3121 may be greater than the thickness d2 of the second lower protective layer 220 and the thickness d3 of the adhesive layer 314. For example, the thickness d4 of the first semiconductor chip 3121 may range from 30 μm to 40 μm.

Referring to FIGS. 1 and 2B, sidewalls 210s of the first lower protective layer 210 and sidewalls 220s of the second lower protective layer 220 may not be vertically aligned with sidewalls 312ls of the first semiconductor chip 3121. Thus, a step structure SS may be formed between the first semiconductor chip 3121 and the second lower protective layer 220.

Particularly, the first semiconductor chip 3121 may have first sidewalls 312ls opposite to each other in the first direction D1. The second lower protective layer 220 may have second sidewalls 220s opposite to each other in the first direction D1. The second sidewalls 220s may be spaced apart from the first sidewalls 312ls in a plan view or may be offset from the first sidewalls 312ls. For example, the second sidewalls 220s may not be vertically aligned with the first sidewalls 312ls. In some embodiments, a distance w1 between the second sidewalls 220s (i.e., a width of the second lower protective layer 220 in the first direction D1) may be greater than a distance w2 between the first sidewalls 312ls (i.e., a width of the first semiconductor chip 3121 in the first direction D1). Thus, a portion of the top surface of the second lower protective layer 220 may not be covered by the first semiconductor chip 3121 and the adhesive layer 314.

The first lower protective layer 210 may have third sidewalls 210s opposite to each other in the first direction D1. The third sidewalls 210s may be vertically aligned or substantially coplanar with the second sidewalls 220s. For example, the third sidewalls 210s of the first lower protective layer 210 may be substantially coplanar with the second sidewalls 220s of the lower protective layer 220. A distance w1 between the third sidewalls 210s (i.e., a width of the first lower protective layer 210 in the first direction D1) may be greater than the width w2 of the first semiconductor chip 3121. Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

Referring to FIGS. 1 and 2C, the first upper protective layer 410 and the second upper protective layer 420 may be sequentially stacked on the uppermost semiconductor chip 312u (hereinafter, referred to as a second semiconductor chip) of the semiconductor chips 312. The first upper protective layer 410 may be disposed directly on a top surface of the second semiconductor chip 312u and may be in contact with a bottom surface of the second upper protective layer 420.

A sidewall 410s of the first upper protective layer 410 may be vertically aligned with a sidewall 420s of the second upper protective layer 420. For example, the sidewall 410s of the first upper protective layer 410 may be substantially coplanar with the sidewall 420s of the second upper protective layer 420. The sidewall 410s of the first upper protective layer 410 and the sidewall 420s of the second upper protective layer 420 may be spaced apart from a sidewall 312us of the second semiconductor chip 312u in a plan view or may be offset from the sidewall 312us of the second semiconductor chip 312u.

A thickness d5 of the first upper protective layer 410 may be less than a thickness d6 of the second upper protective layer 420. The thickness d5 of the first upper protective layer 410 may also be less than a thickness d1 of the first lower protective layer 210. For example, the thickness d5 of the first upper protective layer 410 may range from 1 μm to 10 μm. For example, the thickness d6 of the second upper protective layer 420 may range from 15 μm to 25 μm. For example, a distance d7 between a top surface of the second upper protective layer 420 and the top surface of the mold layer 150 may range from 110 μm to 130 μm.

A thickness d8 of the second semiconductor chip 312u may be greater than the thickness d5 of the first upper protective layer 410 and the thickness d6 of the second upper protective layer 420. For example, the thickness d8 of the second semiconductor chip 312u may range from 30 μm to 40 μm.

Figure 3:
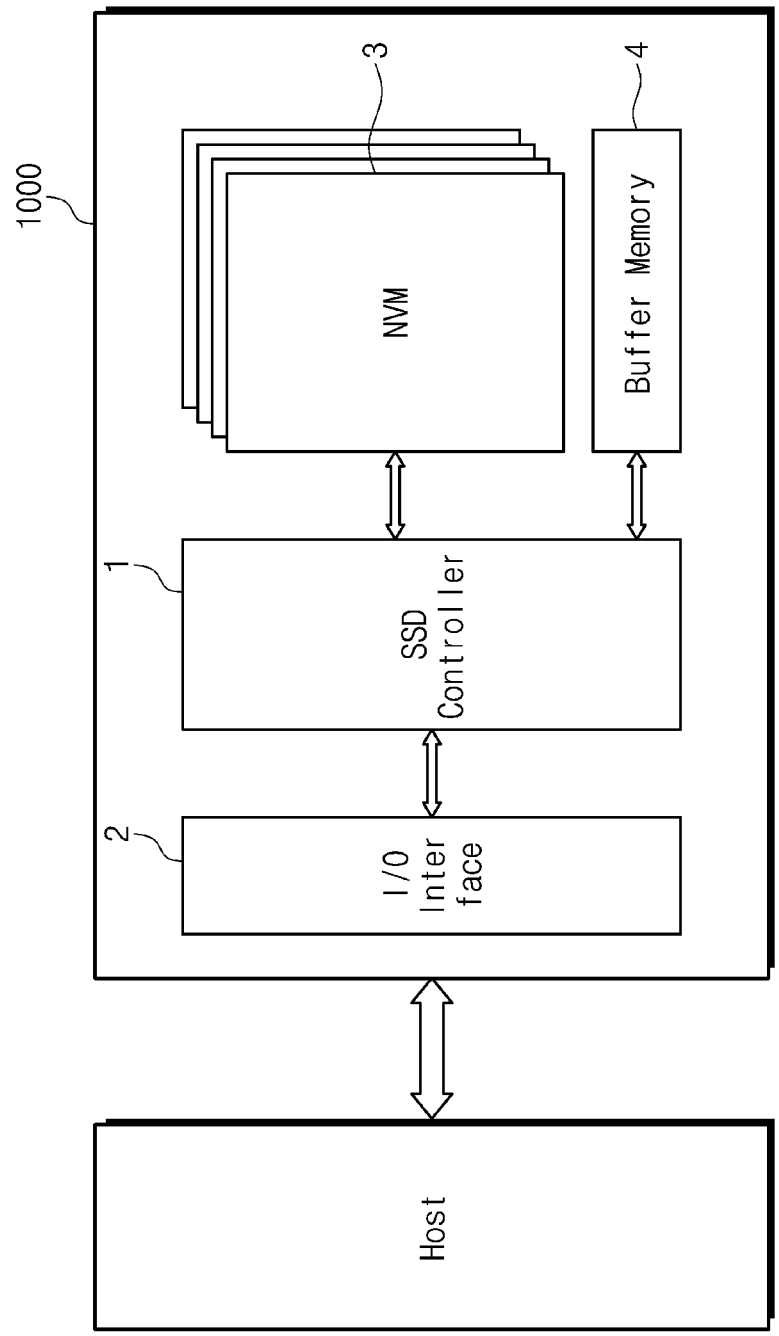
FIG. 3 is a block diagram illustrating schematic components of a semiconductor package according to some embodiments of the inventive concepts.

FIG. 3 is a block diagram illustrating schematic components of a semiconductor package according to some embodiments of the inventive concepts.

Referring to FIGS. 1 and 3, according to some embodiments of the inventive concepts, a semiconductor package 1000 may be a solid-state drive (SSD) package. The semiconductor package 1000 may store or read data in response to a read/write request of a host (i.e., an external device). The semiconductor package 1000 may include an SSD controller 1, an input/output (I/O) interface 2, a plurality of non-volatile memory devices 3, and a buffer memory device 4.

The lower semiconductor chip 502 of FIG. 1 may include the SSD controller 1. The SSD controller 1 may exchange signals with the host through the I/O interface 2. The SSD controller 1 may receive signals from the host to write data in the non-volatile memory devices 3 and/or to read data from the non-volatile memory devices 3.

The I/O interface 2 may provide physical connection between the host and the semiconductor package 1000. For example, the I/O interface 2 may be provided in the form of a ball grid array (BGA) structure, like the external connection terminals 120 of FIG. 1. The I/O interface 2 may provide interfacing with the semiconductor package 1000 in response to a bus format.

The semiconductor chips 312 of FIG. 1 may include the non-volatile memory devices 3 and the buffer memory device 4. The non-volatile memory devices 3 may be NAND flash memory devices. Alternatively, the non-volatile memory devices 3 may be phase change random access memory (PRAM) devices, magnetic random access memory (MRAM) devices, resistive random access memory (ReRAM) devices, ferroelectric random access memory (FRAM) devices, or NOR flash memory devices.

The buffer memory device 4 may temporarily store data transmitted between the SSD controller 1 and the non-volatile memory devices 3 and data transmitted between the SSD controller 1 and the host. The buffer memory device 4 may include a random access memory device such as a DRAM device or a SRAM device. Alternatively, the buffer memory device 4 may include a non-volatile memory device such as a flash memory device, a PRAM device, a MRAM device, a ReRAM device, or a FRAM device.

Figure 4:
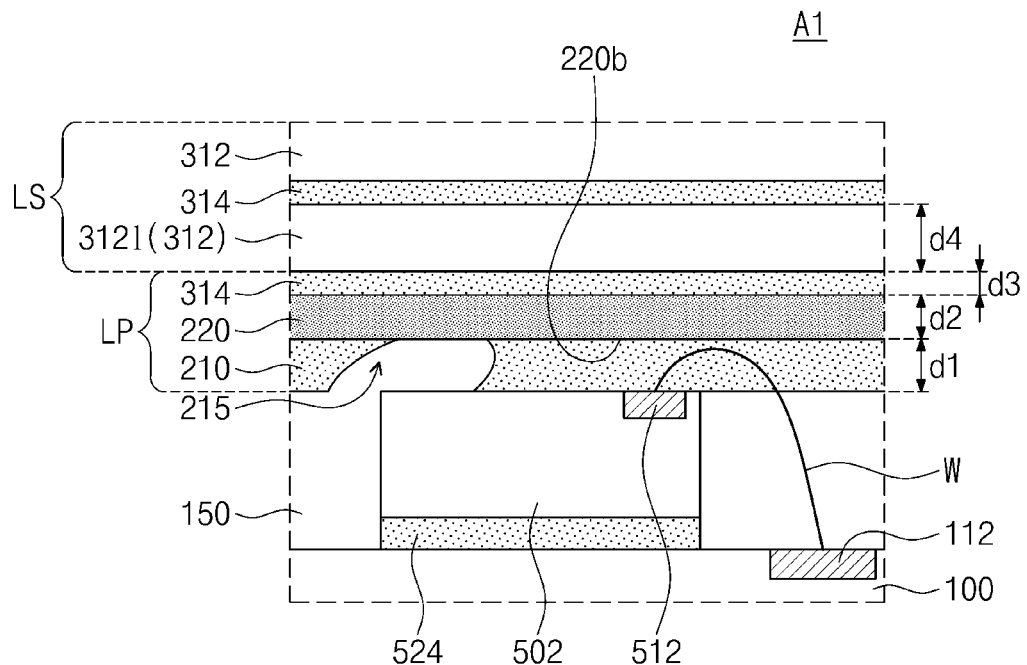
FIG. 4 is a cross-sectional view of another embodiment of portion 'A' of FIG. 1, depicted as portion 'A1' to illustrate semiconductor packages according to other embodiments of the inventive concepts.

FIG. 4 illustrates another embodiment of semiconductor packages from the perspective of a cross-sectional view corresponding to the portion 'A' of FIG. 1. As this embodiment contains differences for the portion 'A' as illustrated in FIG. 1, the portion of FIG. 4 will be herein referenced as portion 'A1.' Differences between the following embodiments and the above embodiments as discussed, for example, with respective to FIG. 2A will be mainly described. The descriptions to the same components as in the above embodiments may be omitted for the purpose of ease and convenience in explanation.

Referring to FIG. 4, the recess 215 may have a portion vertically penetrating the first lower protective layer 210. The mold layer 150 may penetrate the first lower protective layer 210 so as to be in contact with a bottom surface 220b of the second lower protective layer 220. At the bottom surface 220b of the second lower protective layer 220, the top surface of the first lower protective layer 210 may be coplanar with a top surface of the mold layer 150. The bottom surface 220b of the second lower protective layer 220 may be flat without a recessed or protruding portion.

Figure 5:
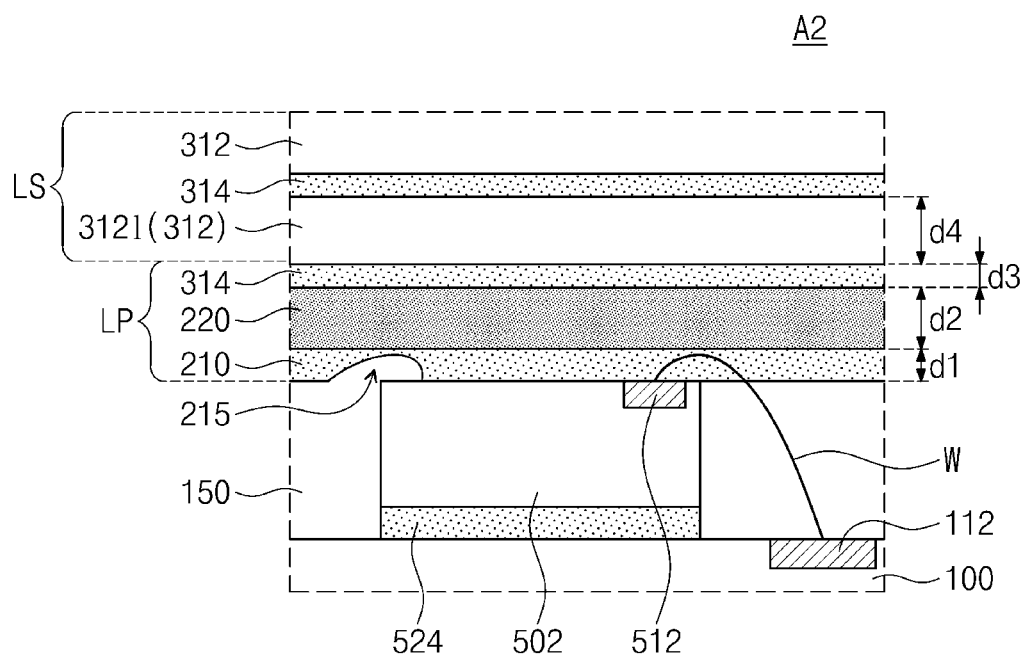
FIG. 5 is a cross-sectional view of another embodiment of portion 'A' of FIG. 1, depicted as portion 'A2' to illustrate semiconductor packages according to other embodiments of the inventive concepts.

FIG. 5 illustrates another embodiment of semiconductor packages from the perspective of a cross-sectional view corresponding to the portion 'A' of FIG. 1. As this embodiment contains differences from the portion 'A' as illustrated in FIG. 1, the portion of FIG. 5 will be herein referenced as portion 'A2.' Differences between the following embodiments and the above embodiments as discussed, for example, with respective to FIG. 2A will be mainly described. The descriptions to the same components as in the above embodiments may be omitted for the purpose of ease and convenience in explanation.

Referring to FIG. 5, the thickness d2 of the second lower protective layer 220 may be greater than the thickness d1 of the first lower protective layer 210. The thickness d1 of the first lower protective layer 210 may be greater than the thickness d3 of the adhesive layer 314 and may be less than the thickness d4 of the first semiconductor chip 3121.

Figure 6A:
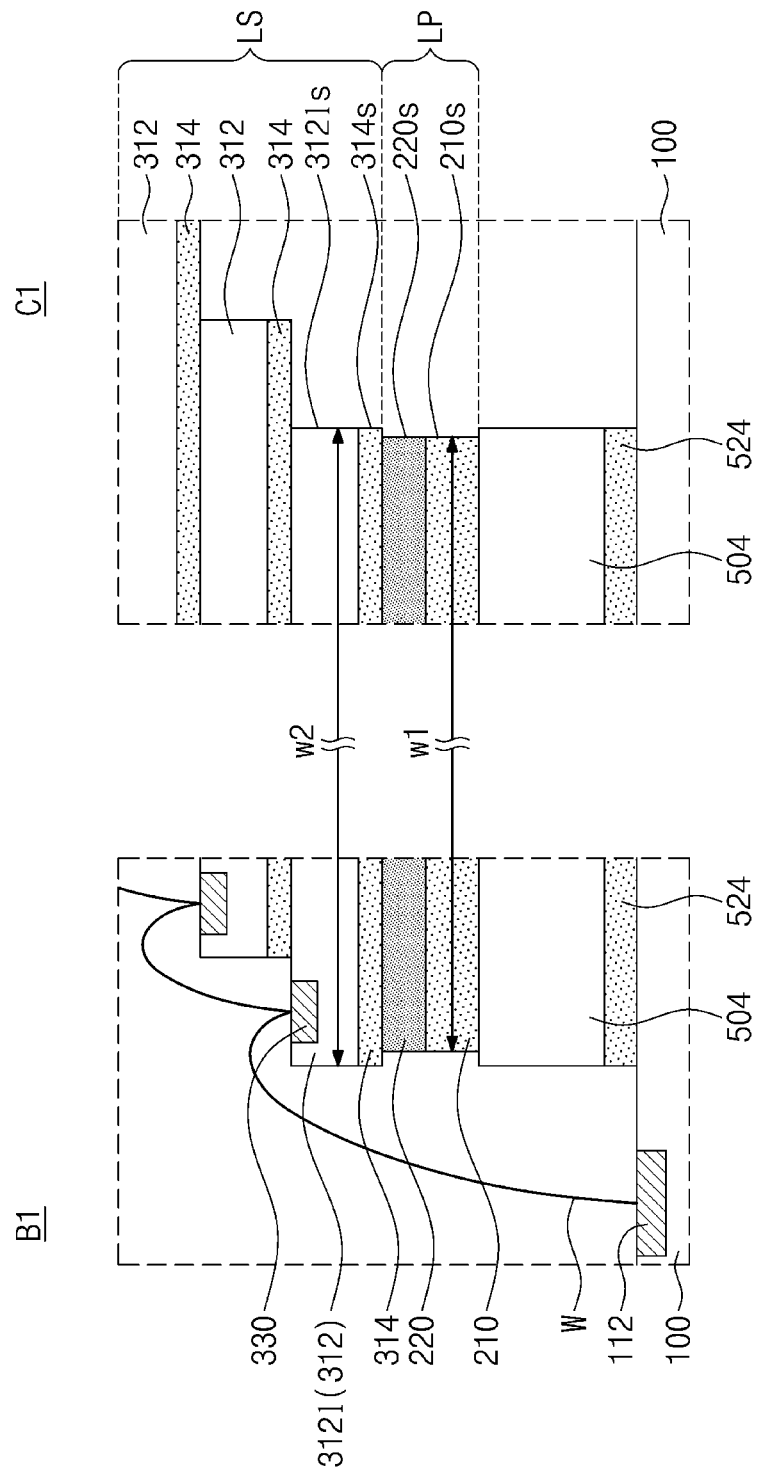
FIG. 6A is a cross-sectional view of another embodiment of portions 'B' and 'C' of FIG. 1, depicted as portions 'B1' and 'C1' to illustrate semiconductor packages according to other embodiments of the inventive concepts.

FIG. 6A illustrates another embodiment of semiconductor packages from the perspective of a cross-sectional view corresponding to the portions 'B' and 'C' of FIG. 1. As this embodiment contains differences for the portions 'B' and 'C' as illustrated in FIG. 1, the portions of FIG. 6A will be herein referenced as portions 'B1' and 'C1.' Differences between the following embodiments and the above embodiments as discussed, for example, with respective to FIG. 2B will be mainly described. The descriptions to the same components as in the above embodiments may be omitted for the purpose of ease and convenience in explanation.

Referring to FIG. 6A, the first semiconductor chip 3121 may have first sidewalls 312ls opposite to each other in a horizontal direction. The second lower protective layer 220 may have second sidewalls 220s opposite to each other in the horizontal direction. A distance w1 between the second sidewalls 220s (i.e., a width of the second lower protective layer 220 in the horizontal direction) may be less than a distance w2 between the first sidewalls 312ls (i.e., a width of the first semiconductor chip 3121 in the horizontal direction). The top surface of the second lower protective layer 220 may be completely covered by the adhesive layer 314. In some embodiments, the first lower protective layer 210 may cover portions of the top surfaces of the spacers 504, and the mold layer 150 may cover other portions of the top surfaces of the spacers 504.

Figure 6B:
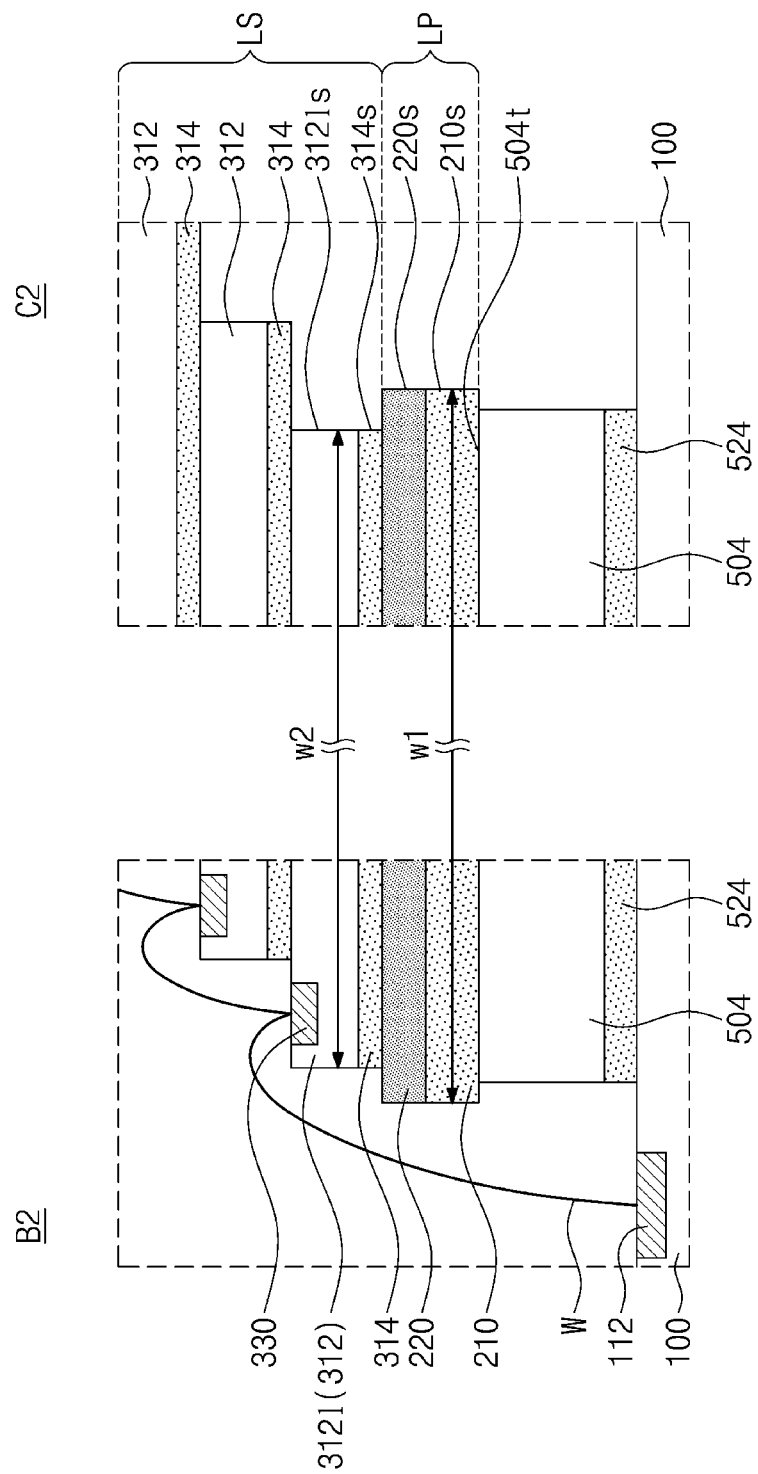
FIG. 6B is a cross-sectional view of another embodiment of portions 'B' and 'C' of FIG. 1, depicted as portions 'B2' and 'C2' to illustrate semiconductor packages according to other embodiments of the inventive concepts.

FIG. 6B illustrates another embodiment of semiconductor packages from the perspective of a cross-sectional view corresponding to the portions 'B' and 'C' of FIG. 1. As this embodiment contains differences for the portions 'B' and 'C' as illustrated in FIG. 1, the portions of FIG. 6B will be herein referenced as portions 'B2' and 'C2.' Differences between the following embodiments and the above embodiments as discussed, for example, with respective to FIG. 2B will be mainly described. The descriptions to the same components as in the above embodiments may be omitted for the purpose of ease and convenience in explanation.

Referring to FIG. 6B, sidewalls 210s of the first lower protective layer 210 and sidewalls 220s of the second lower protective layer 220 may laterally protrude from sidewalls of the spacers 504. For example, the sidewalls 210s of the first lower protective layer 210 and the sidewalls 220s of the second lower protective layer 220 may not vertically overlap with top surfaces 504t of the spacers 504. A distance w2 between sidewalls 312ls of the first semiconductor chip 3121 may be less than a distance w1 between the sidewalls 220s of the second lower protective layer 220.

Figure 6C:
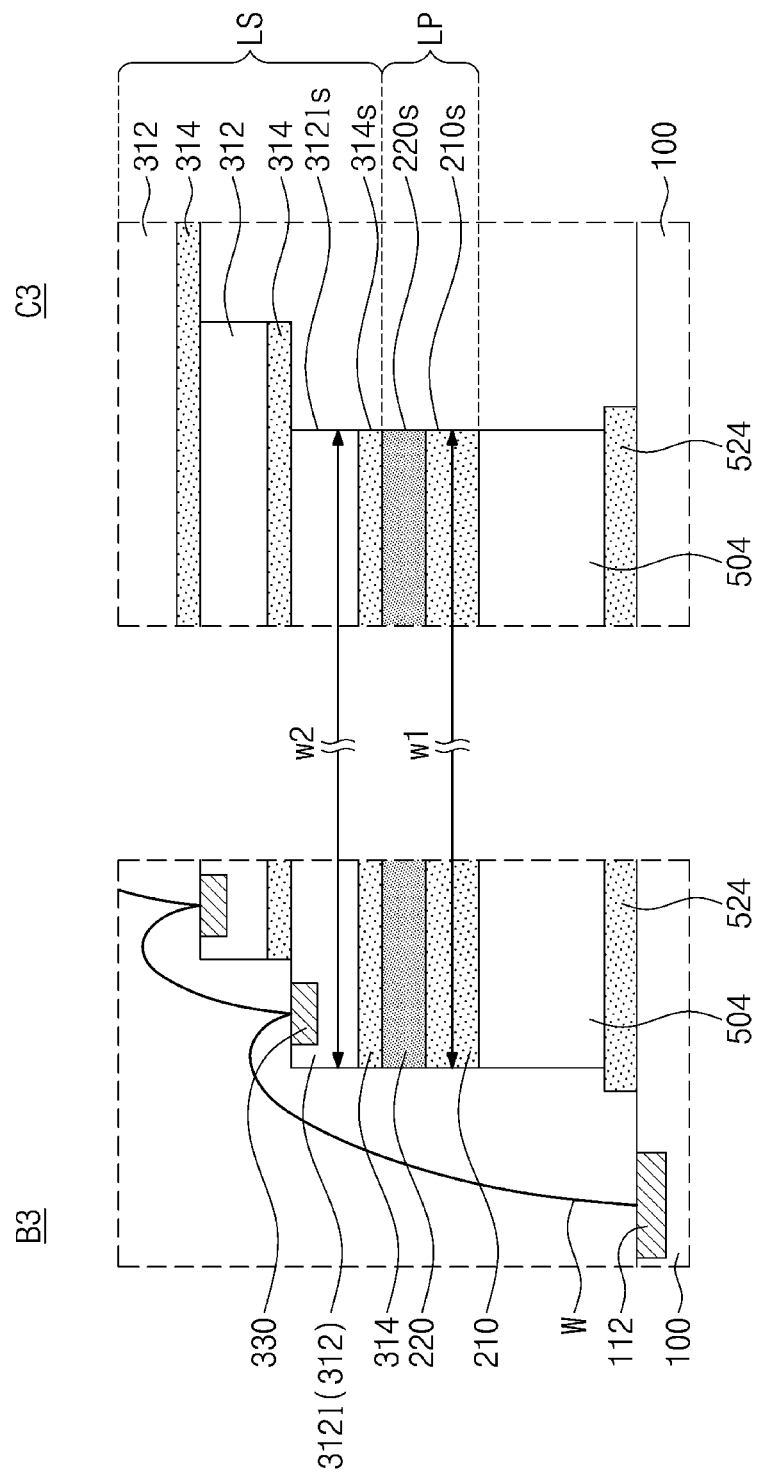
FIG. 6C is a cross-sectional view of another embodiment of portions 'B' and 'C' of FIG. 1, depicted as portions 'B3' and 'C3' to illustrate semiconductor packages according to other embodiments of the inventive concepts.

FIG. 6C illustrates another embodiment of semiconductor packages from the perspective of a cross-sectional view corresponding to the portions 'B' and 'C' of FIG. 1. As this embodiment contains differences for the portions 'B' and 'C' as illustrated in FIG. 1, the portions of FIG. 6C will be herein referenced as portions 'B3' and 'C3.' Differences between the following embodiments and the above embodiments as discussed, for example, with respective to FIG. 2B will be mainly described. The descriptions to the same components as in the above embodiments may be omitted for the purpose of ease and convenience in explanation.

Referring to FIG. 6C, sidewalls 210s of the first lower protective layer 210, sidewalls 220s of the second lower protective layer 220, sidewalls 314s of the adhesive layer 314 and sidewalls 312ls of the first semiconductor chip 3121 may be vertically aligned with each other. The sidewalls 210s of the first lower protective layer 210, the sidewalls 220s of the second lower protective layer 220, the sidewalls 314s of the adhesive layer 314 and the sidewalls 312ls of the first semiconductor chip 3121 may be coplanar with each other.

Figure 7A:
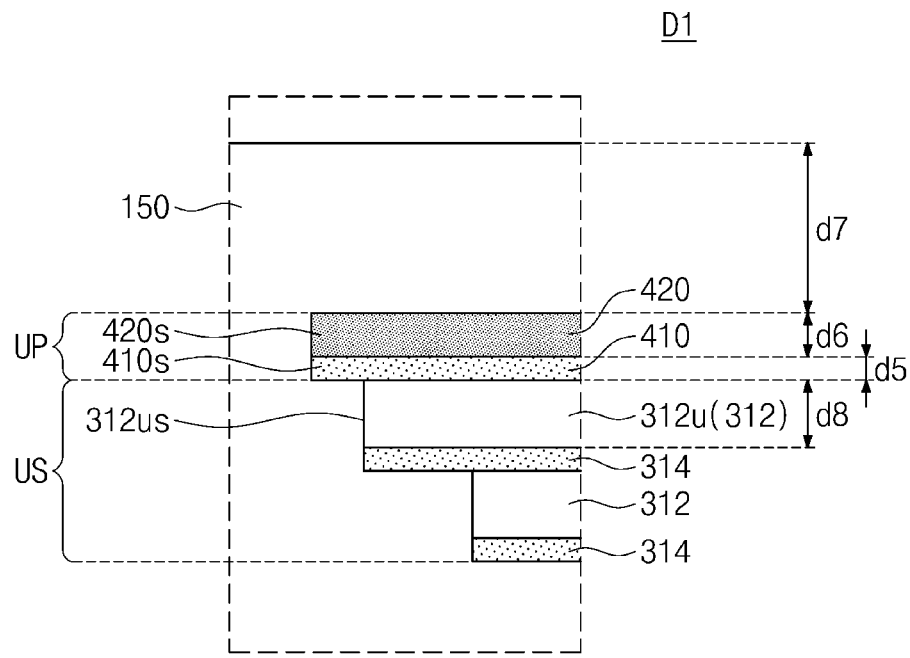
FIG. 7A is a cross-sectional view of another embodiment of portion 'D' of FIG. 1, depicted as portion 'D1' to illustrate semiconductor packages according to other embodiments of the inventive concepts.

FIG. 7A illustrates another embodiment of semiconductor packages from the perspective of a cross-sectional view corresponding to the portion 'D' of FIG. 1. As this embodiment contains differences for the portion 'D' as illustrated in FIG. 1, the portion of FIG. 7A will be herein referenced as portion 'D' Differences between the following embodiments and the above embodiments as discussed, for example, with respective to FIG. 2C will be mainly described. The descriptions to the same components as in the above embodiments may be omitted for the purpose of ease and convenience in explanation.

Referring to FIG. 7A, a sidewall 410s of the first upper protective layer 410 and a sidewall 420s of the second upper protective layer 420 may laterally protrude from a sidewall 312us of the second semiconductor chip 312u. For example, the sidewall 410s of the first upper protective layer 410 and the sidewall 420s of the second upper protective layer 420 may not vertically overlap with a top surface of the second semiconductor chip 312u.

Figure 7B:
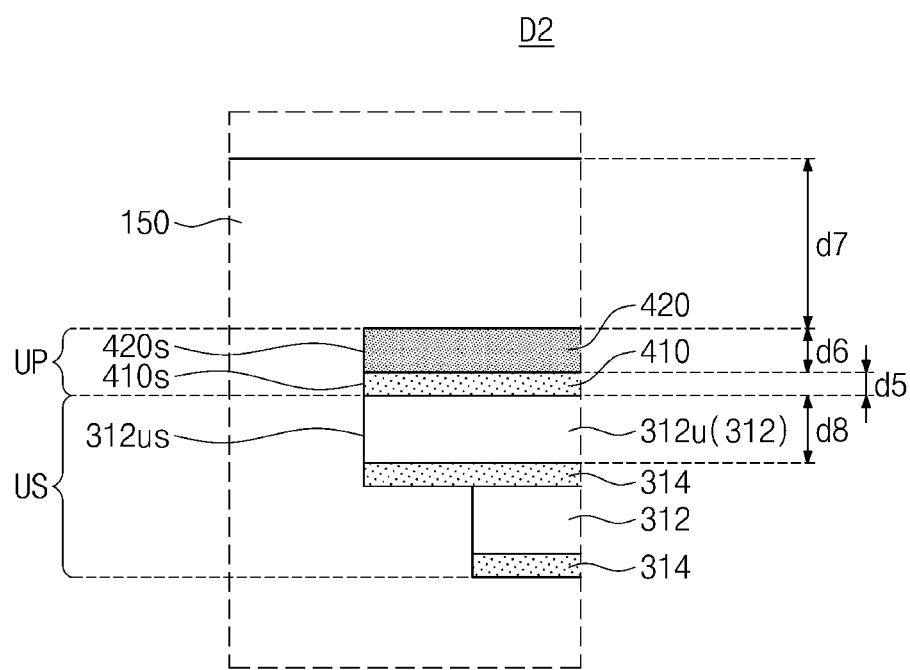
FIG. 7B is a cross-sectional view of another embodiment of portion 'D' of FIG. 1, depicted as portion 'D2' to illustrate semiconductor packages according to other embodiments of the inventive concepts.

FIG. 7B illustrates another embodiment of semiconductor packages from the perspective of a cross-sectional view corresponding to the portion 'D' of FIG. 1. As this embodiment contains differences for the portion 'D' as illustrated in FIG. 1, the portion of FIG. 7B will be herein referenced as portion 'D2.' Differences between the following embodiments and the above embodiments as discussed, for example, with respective to FIG. 2C will be mainly described. The descriptions to the same components as in the above embodiments may be omitted for the purpose of ease and convenience in explanation.

Referring to FIG. 7B, a sidewall 410s of the first upper protective layer 410 and a sidewall 420s of the second upper protective layer 420 may be vertically aligned with a sidewall 312us of the second semiconductor chip 312u. The sidewall 410s of the first upper protective layer 410 and the sidewall 420s of the second upper protective layer 420 may be coplanar with the sidewall 312us of the second semiconductor chip 312u.

Figure 8:
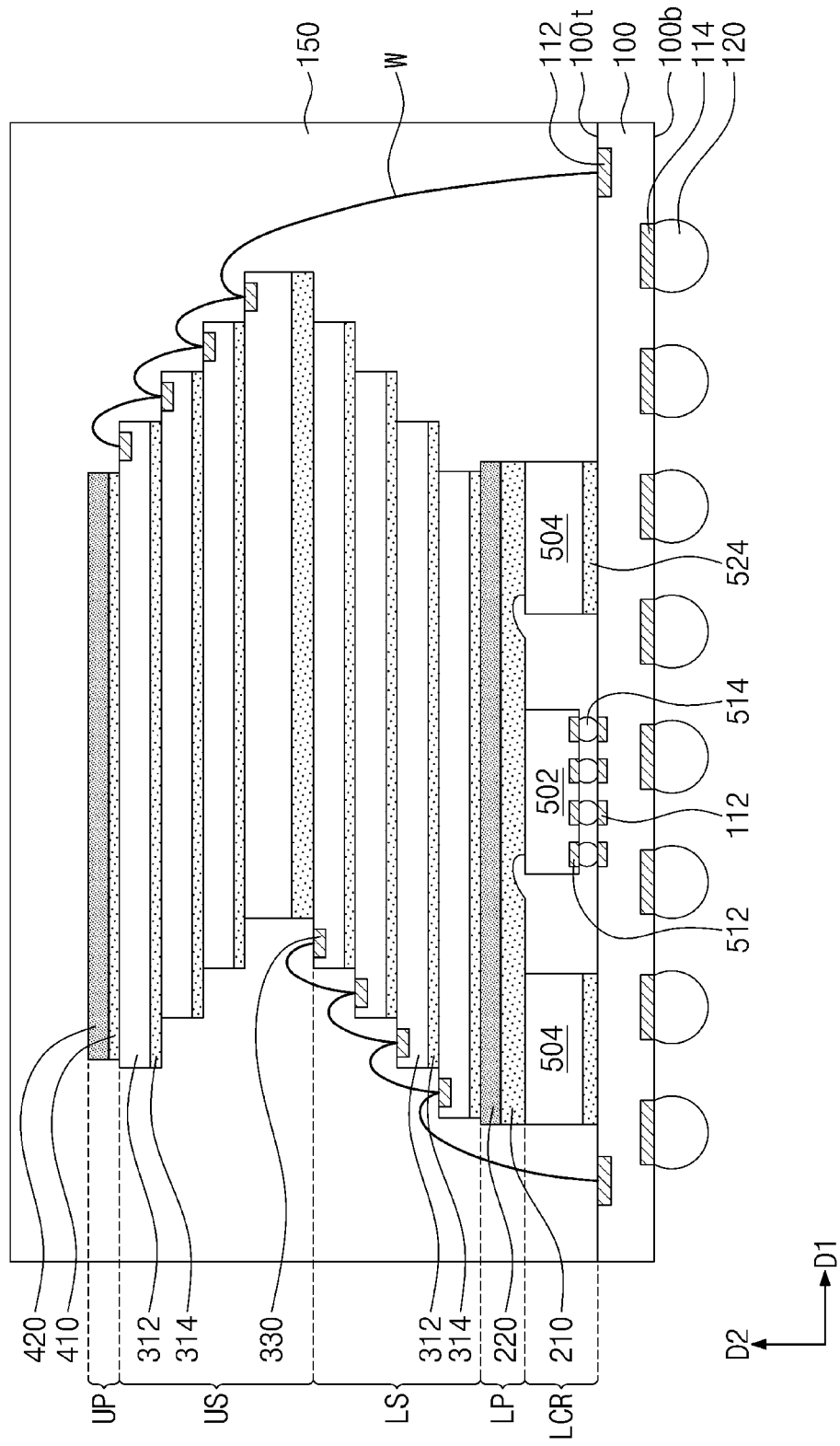
FIG. 8 is a cross-sectional view illustrating a semiconductor package according to some embodiments of the inventive concepts.

FIG. 8 is a cross-sectional view illustrating a semiconductor package according to some embodiments of the inventive concepts.

Referring to FIG. 8, lower chip pads 512 may be disposed on a bottom surface of the lower semiconductor chip 502. The lower chip pads 512 may be electrically connected to the upper conductive pads 112 of the substrate 100 through lower connection terminals 514. In certain embodiments, the lower chip pads 512 may be connected directly to the upper conductive pads 112 without the lower connection terminals 514.

Figure 9:
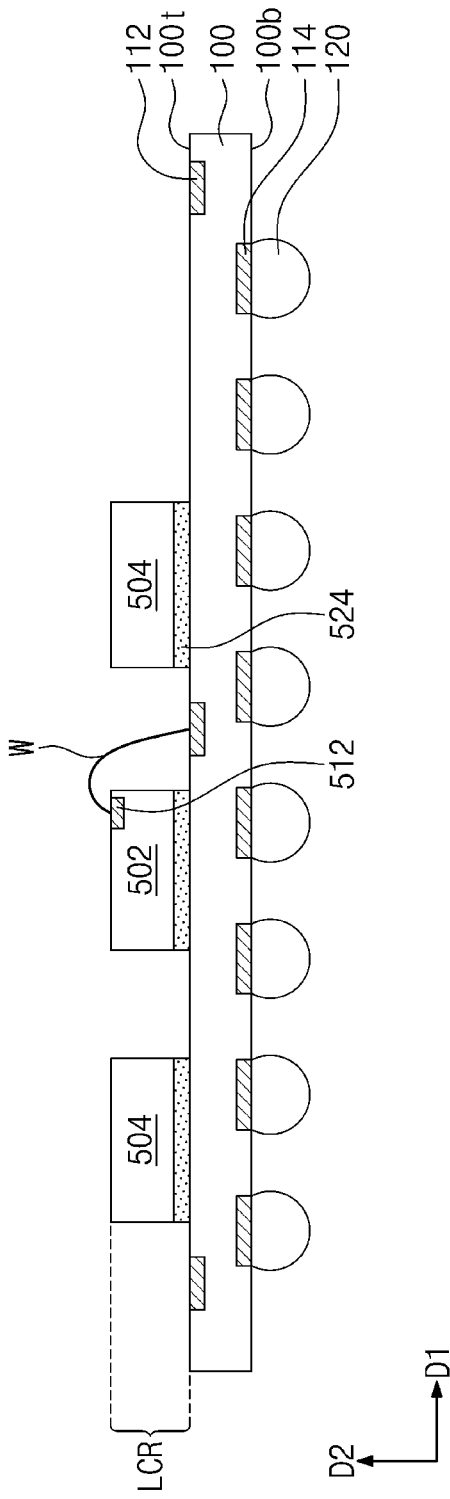
FIGS. 9, 10 and 13 are cross-sectional views illustrating a method of manufacturing a semiconductor package, according to some embodiments of the inventive concepts.
Figure 10:
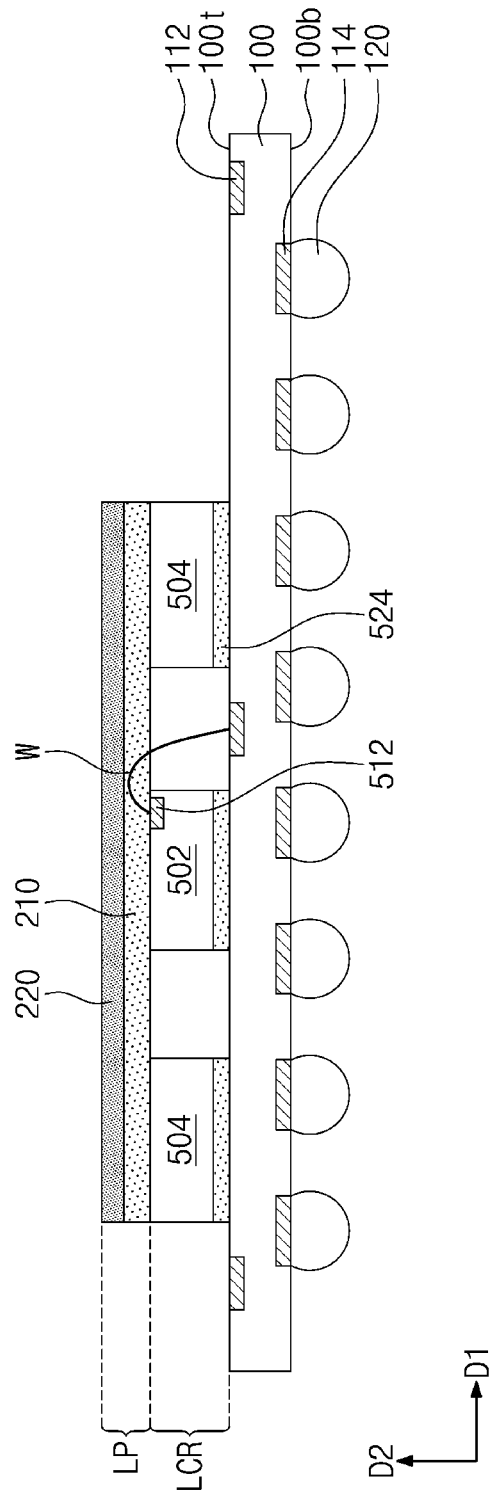
Figure 11:
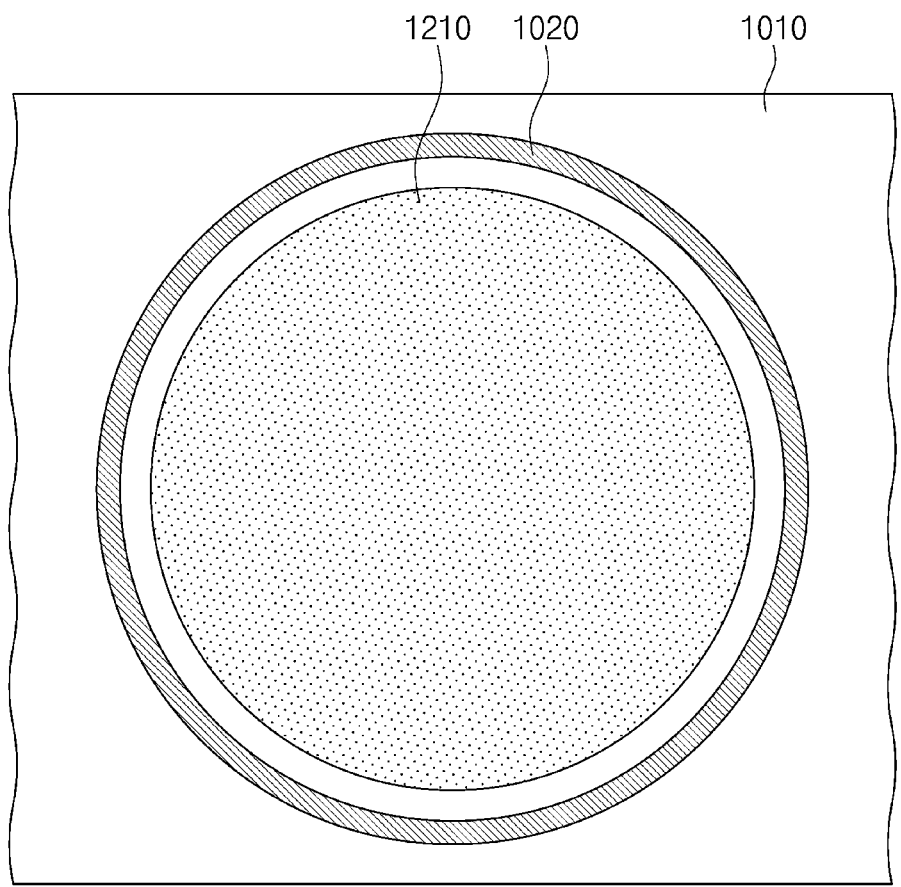
FIGS. 11 and 12 are plan views illustrating a method of forming a protective film layer, according to some embodiments of the inventive concepts.
Figure 12:
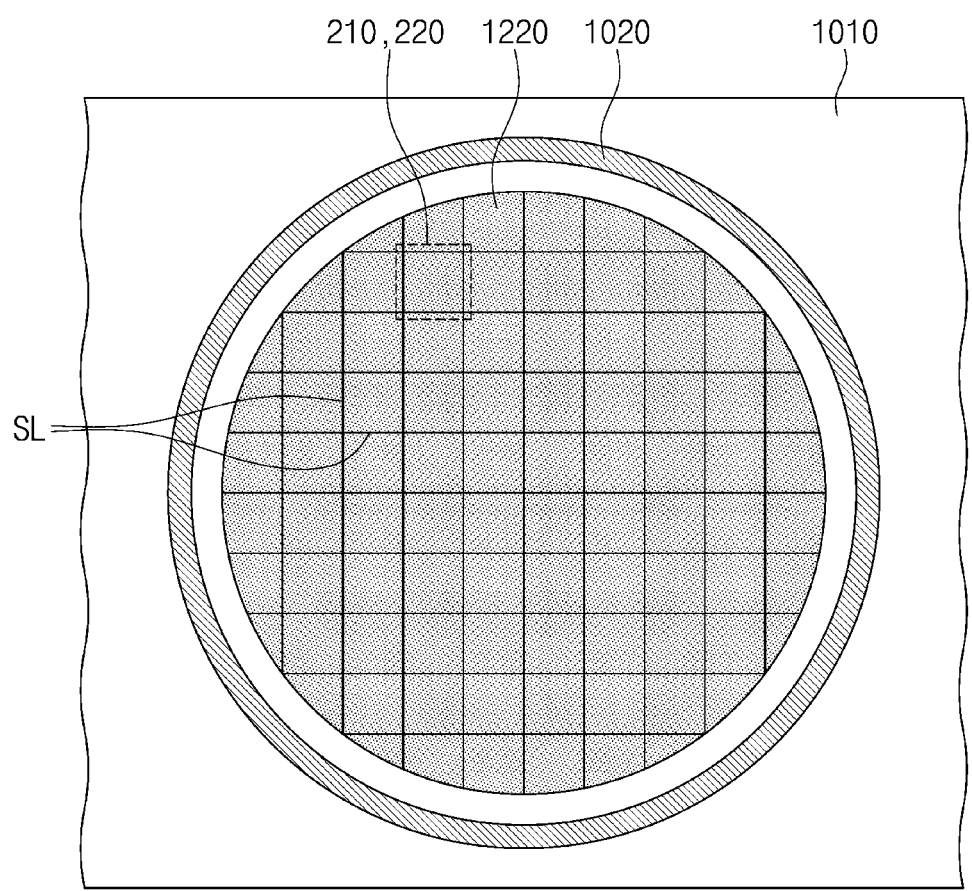
Figure 13:
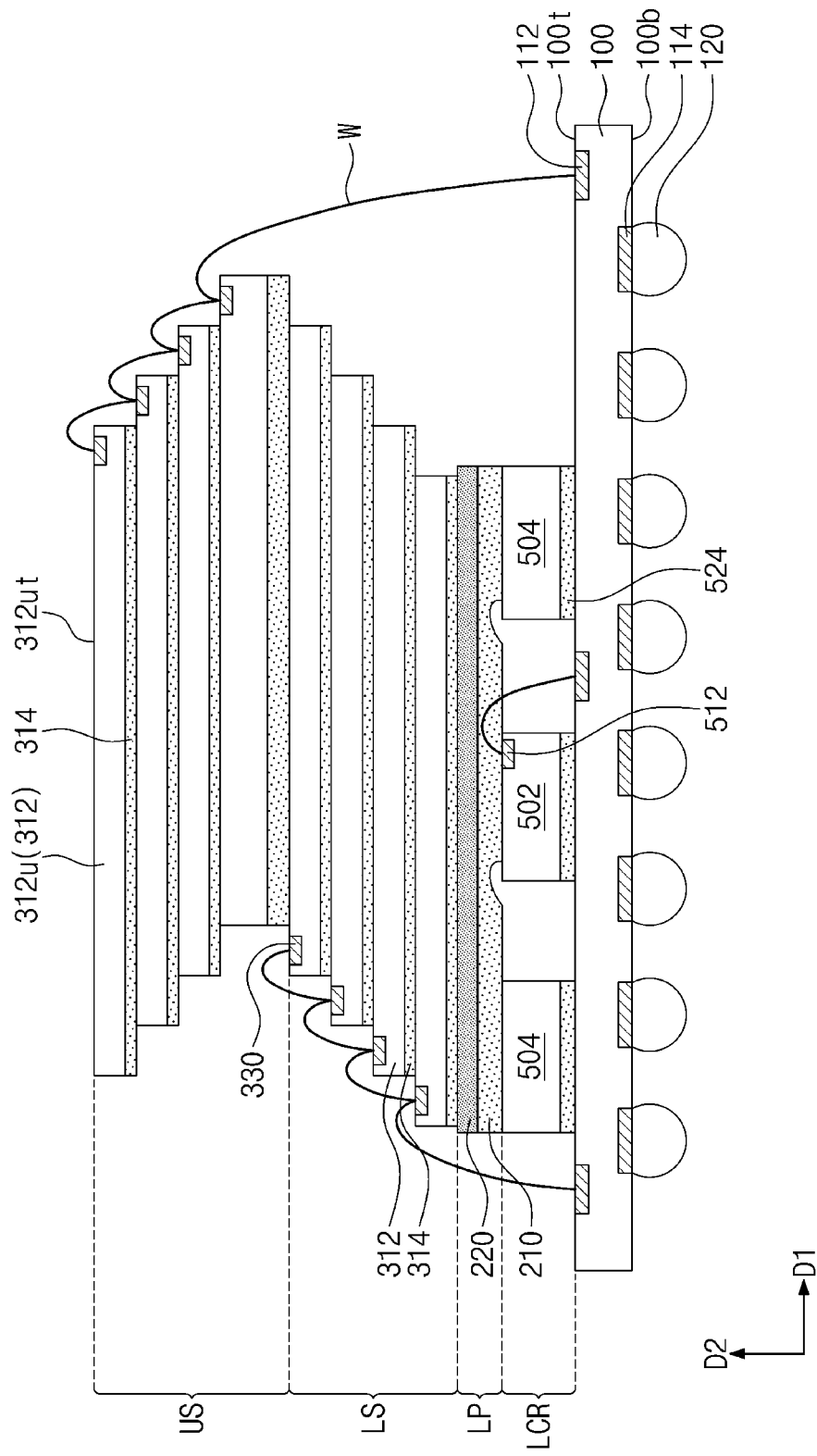

FIGS. 9, 10 and 13 are cross-sectional views illustrating a method of manufacturing a semiconductor package, according to some embodiments of the inventive concepts. FIGS. 11 and 12 are plan views illustrating a method of forming a first lower protective layer and a second lower protective layer, according to some embodiments of the inventive concepts.

Referring to FIG. 9, a lower chip region LCR may be formed on a substrate 100. The formation of the lower chip region LCR may include disposing a plurality of pillars 502 and 504 on a top surface 100t of the substrate 100. The plurality of pillars 502 and 504 may be adhered to the substrate 100 through lower adhesive layers 524. A lower semiconductor chip 502 of the plurality of pillars 502 and 504 may be connected to a corresponding one of upper conductive pads 112 of the substrate 100 through a conductive wire W.

Referring to FIG. 10, a lower protective layer region LP may be formed on the lower chip region LCR. The formation of the lower protective layer region LP may include attaching or bonding a lower protective film layer 210 and 220 including a first lower protective layer 210 and a second lower protective layer 220, which are sequentially stacked, onto the plurality of pillars 502 and 504.

A method of forming the lower protective film layer 210 and 220 will be described with reference to FIGS. 11 and 12.

Referring to FIG. 11, a guide ring 1020 may be attached on a flexible film 1010. The guide ring 1020 may include a material having a high stiffness and may include, for example, a metal material such as stainless and/or aluminum. A first film layer 1210 may be attached to the flexible film 1010 inside the guide ring 1020. For example, the first film layer 1210 may include or may be formed of a die attach film (DAF). For example, the DAF may be a polymer adhesive and may include or may be formed of a thermosetting polymer or a thermoplastic polymer.

Referring to FIG. 12, a second film layer 1220 may be attached on the first film layer 1210. The second film layer 1220 may include a material of which a stiffness is higher than that of the first film layer 1210. For example, the second film layer 1220 may include or may be formed of a polyimide (PI).

The first film layer 1210 and the second film layer 1220 may be cut along a scribe line SL to form a plurality of the lower protective film layers 210 and 220.

Subsequently, the guide ring 1020 may be removed, and then, the flexible film 1010 may be stretched to separate the plurality of lower protective film layers 210 and 220 from each other.

Referring to FIG. 13, adhesive layers 314 and semiconductor chips 312 may be stacked on the lower protective layer region LP to form a lower stack LS and an upper stack US. The formation of the lower stack LS and the upper stack US may include vertically stacking the semiconductor chips 312, each of which has a bottom surface on which the adhesive layer 314 is attached. Subsequently, chip pads 330 of the semiconductor chips 312 may be connected to corresponding ones of the upper conductive pads 112 of the substrate 100 through conductive wires W.

Referring again to FIG. 1, an upper protective film layer 410 and 420 including a first upper protective layer 410 and a second upper protective layer 420 may be attached on the upper stack US. A method of forming the upper protective film layer 410 and 420 may be the same/similar as the method of forming the lower protective film layer 210 and 220 described with reference to FIGS. 11 and 12. The upper protective film layer 410 and 420 may cover a portion of a top surface of the uppermost semiconductor chip 312 but may not cover the chip pads 330 located on the top surface of the uppermost semiconductor chip 312.

Thereafter, a mold layer 150 may be formed on the substrate 100. The mold layer 150 may be formed entirely on the top surface 100t of the substrate 100 to cover the lower stack LS, the upper stack US and the upper protective layer region UP. The mold layer 150 may fill spaces between the pillars 502 and 504 in the lower chip region LCR. At this time, the mold layer 150 may be introduced or provided onto top surfaces of the pillars 502 and 504 to form recesses 215 in a bottom surface of the first lower protective layer 210. As illustrated in FIG. 4, the mold layer 150 may penetrate the first lower protective layer 210 but may not penetrate the second lower protective layer 220.

According to the embodiments of the inventive concepts, the semiconductor package having a thin thickness and improved reliability may be provided or realized.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scope of the invention to be determined by the broadest permissible interpretation of the following claims and their equivalents, and shall not be restricted or limited by the foregoing description.

What is claimed is:

1. A semiconductor package comprising:
   a chip stack comprising semiconductor chips vertically stacked on a substrate;
   pillars between the substrate and the chip stack;
   an adhesive layer on a bottom surface of a lowermost semiconductor chip of the semiconductor chips;
   a first lower protective layer between the adhesive layer and the pillars;
   and a mold layer covering the chip stack,
   wherein the first lower protective layer includes a recess recessed from a bottom surface of the first lower protective layer toward a top surface of the first lower protective layer, and
   wherein the mold layer fills a space between the pillars and filling the recess.

2. The semiconductor package of claim 1, wherein the recess has a portion vertically overlapping with the pillars.

3. The semiconductor package of claim 1, wherein the recess has a length of 1 µm to 30 µm in a first direction perpendicular to the top surface of the substrate.

4. The semiconductor package of claim 3, wherein the recess has a concave in the first direction.

5. The semiconductor package of claim 1, wherein the recess has a rounded inner surface.

6. The semiconductor package of claim 1, wherein the recess has an asymmetrical shape along a second direction parallel to the top surface of the substrate.

7. The semiconductor package of claim 1, further comprising a second lower protective layer between the first lower protective layer and the adhesive layer.

8. The semiconductor package of claim 7, wherein the recess penetrates the first lower protective layer and is in contact with the second lower protective layer.

9. The semiconductor package of claim 1, wherein the top surface of the first lower protective layer is coplanar with a top surface of the mold layer.

10. A semiconductor package comprising:
    a chip stack comprising semiconductor chips vertically stacked on a substrate;

wherein the chip stack comprises a first semiconductor chip located at a lowest level and a second semiconductor chip located at a highest level of the semiconductor chips;

upper conductive pads on a top surface of the substrate;

pillars between the top surface of the substrate and the chip stack, wherein at least one of the pillars comprises a lower semiconductor chip;

wherein the lower semiconductor chip includes lower chip pads on a lower surface of the lower semiconductor chip;

a lower connection terminal interposed between the upper conductive pads and the lower chip pads;

an adhesive layer on a bottom surface of the first semiconductor chip;

a first lower protective layer between the adhesive layer and the pillars; and a mold layer covering the chip stack and filling a space between the pillars.

11. The semiconductor package of claim 10, further comprising a recess recessed from a bottom surface of the first lower protective layer toward a top surface of the first lower protective layer.

12. The semiconductor package of claim 11, wherein the mold layer fills the recess.

13. The semiconductor package of claim 10, further comprising a second lower protective layer between the first lower protective layer and the adhesive layer;

a first upper protective layer on the second semiconductor chip; and a second upper protective layer on the first upper protective layer.

14. The semiconductor package of claim 13, wherein a thickness of the first lower protective layer is greater than the thickness of the first upper protective layer.

15. The semiconductor package of claim 13, wherein a thickness of the first upper protective layer is less than a thickness of the second upper protective layer.

16. The semiconductor package of claim 13, wherein the second lower protective layer has a tensile strength higher than that of the first lower protective layer.

17. The semiconductor package of claim 10, wherein at least one of the pillars comprises a spacer.

18. The semiconductor package of claim 17, further comprising a lower adhesive layer interposed between the top surface of the substrate and the spacer.

19. The semiconductor package of claim 17, wherein the mold layer fills a space between the lower semiconductor chip and the spacer.

* * * * *